United States Patent
Ehlers et al.

(10) Patent No.: US 11,460,015 B2
(45) Date of Patent: Oct. 4, 2022

(54) PRINTED CIRCUIT BOARD MODULE (71) Applicant: ebm-papst St. Georgen GmbH & Co. KG, St. Georgen (DE)

(72) Inventors: Volker Ehlers, St. Georgen (DE); Ralf-Michael Sander, St. Georgen (DE)

(73) Assignee: ebm-papst St. Georgen GmbH & Co. KG, St. Georgen (DE)

( * ) Notice: Subject to any disclaimer, the term of this patent is extended or adjusted under 35 U.S.C. 154(b) by 434 days.

(21) Appl. No.: 16/784,426

(22) Filed: Feb. 7, 2020

(65) Prior Publication Data
US 2020/0173431 A1 Jun. 4, 2020

Related U.S. Application Data (63) Continuation of application No. PCT/EP2018/072314, filed on Aug. 17, 2018.

(30) Foreign Application Priority Data

Sep. 20, 2017 (DE) ...................... 10 2017 121 791.6

(51) Int. Cl.
*H05K 1/11* (2006.01)
*F04B 17/03* (2006.01)
(Continued)

(52) U.S. Cl.
CPC .............. *F04B 17/03* (2013.01); *F04B 15/02* (2013.01); *H05K 1/116* (2013.01); *H05K 1/184* (2013.01);
(Continued)

(58) Field of Classification Search
CPC ... H05K 1/11; H05K 1/14; H05K 1/18; H05K 1/116; H05K 1/181–184; H05K 3/42;
(Continued)

(56) References Cited

U.S. PATENT DOCUMENTS 8,847,078 B2 * 9/2014 Matsuno .............. H05K 1/0274
361/779
2004/0262040 A1 * 12/2004 Ishizuka ................ H05K 1/116
174/262
(Continued)

FOREIGN PATENT DOCUMENTS

DE 2 154 958 A1 5/1973
DE 601 11 330 T2 5/2006
(Continued)

OTHER PUBLICATIONS

European Office Action (in German) dated Jun. 5, 2020 in corresponding EP Application No. 18 756 231.9.
Wikipedia, "Electroless nickel immersion gold", Jun. 21, 2017, Retrieved from the Internet: https://en.wikipedia.org/w/index.php?title=Electroless_nickel_immersion_gold&direction=next& oldid=78.
(Continued)

*Primary Examiner* — Tuan T Dinh
(74) *Attorney, Agent, or Firm* — Harness, Dickey & Pierce, P.L.C.

(57) ABSTRACT

A printed circuit board module (10) has a printed circuit board (20) with a first side (21), a second side (22) and a contact hole (30). A sleeve-type via (32) is provided in the contact hole 30. An annular ring (35, 36) is associated with the via (32), on at least one side (33, 34). The annular ring (35, 36) is arranged on the first side (21) or on the second side (22) of the printed circuit board (20). The annular ring (35, 36) is electrically connected to the via (32). The annular ring (35, 36) has an annular ring edge (40), at least in sections. The printed circuit board module (10) has a solder resist layer (50). It extends, at least in sections, from outside the annular ring edge (40) over the annular ring edge (40) to an outer region (42) of the annular ring (35, 36). An inner region (44) not covered with the solder resist layer (50), remains on the annular ring (35, 36).

13 Claims, 6 Drawing Sheets

(51) Int. Cl.
*F04B 15/02* (2006.01)
*H05K 1/18* (2006.01)
*H05K 3/24* (2006.01)
*H05K 3/28* (2006.01)
*H05K 3/30* (2006.01)
*H05K 3/34* (2006.01)
*H02K 11/21* (2016.01)

(52) U.S. Cl.
CPC ............ *H05K 3/244* (2013.01); *H05K 3/285* (2013.01); *H05K 3/306* (2013.01); *H05K 3/3447* (2013.01); *H05K 3/3452* (2013.01); *H02K 11/21* (2016.01); *H05K 2201/099* (2013.01); *H05K 2201/0989* (2013.01); *H05K 2201/10303* (2013.01)

(58) Field of Classification Search
CPC ........ H05K 3/244; H05K 3/285; H05K 3/306; H05K 3/3447; H05K 3/341
USPC .................. 174/258–264; 361/761, 772–778
See application file for complete search history.

(56) References Cited

U.S. PATENT DOCUMENTS

| | | | | |
|---|---|---|---|---|
| 2008/0217051 | A1* | 9/2008 | Matsui ................ | H05K 1/0269 |
| | | | | 174/266 |
| 2013/0213705 | A1* | 8/2013 | Suehiro ................ | H05K 3/0047 |
| | | | | 29/829 |

FOREIGN PATENT DOCUMENTS

| | | |
|---|---|---|
| DE | 10 2008 002 041 A1 | 12/2009 |
| DE | 10 2009 027 309 A1 | 2/2010 |
| DE | 10 2011 082 537 A1 | 3/2013 |
| JP | 2007-173687 A | 7/2007 |

OTHER PUBLICATIONS

International Search Report (in English) and Written Opinion (in German) dated Oct. 30, 2018 in corresponding PCT Application No. PCT/EP2018/072314.
German Search Report (in German) dated Jun. 1, 2018 in corresponding German Application No. DE102017121793.6.

* cited by examiner

PRINTED CIRCUIT BOARD MODULE

CROSS-REFERENCE TO RELATED APPLICATIONS

This application is a continuation of International Application No. PCT/EP2018/072314, filed Aug. 17, 2018, which claims priority to German Application No. 10 2017 121 791.6, filed Sep. 20, 2017. The disclosures of the above applications are incorporating herein by reference.

FIELD

This disclosure relates to a printed board module.

BACKGROUND

Printed circuit boards are substrates for electronic components. They are used for mechanical fastening and electrical connection of the components.

Printed circuit boards are used under the most varied environmental conditions. Sometimes they are exposed to corrosive materials or media. For example, the use of a printed circuit board, with mounted rotor position sensors for detecting the rotor position of a rotor of an electric motor in transmission fluid, has resulted in corrosion problems in long term tests.

SUMMARY

It is therefore an object of the disclosure to provide a new printed circuit board module.

The disclosure achieves its object by a printed circuit board including a first side, a second side and a contact hole. A sleeve-type via is provided in the contact hole. An annular ring is associated with the via on at least one side. The annular ring is disposed on the first side or on the second side of the printed circuit board and electrically connected to the via. The annular ring, at least in sections, includes an annular ring edge. The printed circuit board module includes a solder resist layer. The solder resist layer extends, at least in sections, from outside the annular ring edge over the annular ring edge to an outer region of the annular ring. An inner region, not covered by the solder resist layer, remains on the annular ring. A nickel-containing layer is applied to at least one annular ring. A gold-containing layer is applied to the nickel-containing layer. The nickel-containing layer and the gold-containing layer extend, at least in sections, into the inner region and into the outer region.

On the one hand, this allows a solder joint. On the other hand, this increases corrosion protection in the region of the annular ring edge. This has proved advantageous when the printed circuit board module is in contact with aggressive media.

According to a preferred embodiment, the inner region has an annular shape. This ensures that a good solder joint is achieved.

According to a preferred embodiment, the inner region around the contact hole, at least in sections, has a radial extension of at least 0.05 mm. Preferably, an extension of at least 0.10 mm, particularly preferably of at least 0.30 mm. This provides a sufficient area for the solder connection.

According to a preferred embodiment, the inner region around the contact hole, at each point, has a radial extension of at least 0.05 mm. Preferably, the extension is of at least 0.10 mm, particularly preferably of at least 0.30 mm. This allows a reliable solder connection.

According to a preferred embodiment, the outer region has an annular shape. This enables protection of the annular ring in the outer region.

According to a preferred embodiment, the outer region around the contact hole, at least in sections, has a radial extension of at least 0.05 mm. Preferably, the extension is of at least 0.10 mm, particularly preferably of at least 0.30 mm. This ensures that protection is achieved.

According to a preferred embodiment, the outer region around the contact hole, at each point, has a radial extension of at least 0.05 mm. The extension is of at least 0.10 mm, particularly preferably of at least 0.30 mm. This enables protection of the annular ring around its entire circumference.

According to the disclosure, a nickel-containing layer is applied to at least one annular ring. A gold-containing layer is applied to the nickel-containing layer. The nickel-containing layer and the gold-containing layer extend, at least in sections, into the inner region and into the outer region. Such an arrangement of layers, together with the solder resist layer in the outer region, results in a corrosion resistant embodiment.

According to a preferred embodiment, the printed circuit board comprises a conductive path that is electrically connected to the outer region of the annular ring. The protected outer region can thus be used for the connection.

According to a preferred embodiment, the printed circuit board module comprises a component with a contact pin. The contact pin is at least partially disposed in the via. The printed circuit board module comprises a solder that is mechanically and electrically connected to the contact pin and to the inner region of the annular ring. Such a contact pin can be securely fastened in the via by means of the solder (soldering agent).

According to a preferred embodiment, the solder is only mechanically connected to the inner region of the annular ring. In this way, the outer region remains covered by the solder resist layer.

According to a preferred embodiment, a protective layer of casting resin is provided on at least one side of the printed circuit board. This ensures protection of the printed circuit board. This can further increase corrosion protection.

The object of the disclosure is also achieved by a pump assembly with an electric motor and a pump. The electric motor comprises a rotor and a stator. The rotor is configured to drive the pump. The pump assembly comprises a printed circuit board module. The printed circuit board module comprises at least one rotor position sensor. The at least one rotor position sensor determines the rotor position of the rotor. The rotor and the printed circuit board module are disposed in the medium to be delivered by the pump. In combination with such a pump assembly, use of the printed circuit board module is particularly advantageous, since the pump assembly can also be used with very aggressive media.

According to a preferred embodiment, the medium to be delivered by the pump is an oil, particularly a mineral oil. Some such media have proved very aggressive. Thus, this is where the printed circuit board module can particularly preferably be used.

Further details and advantageous further developed embodiments of the disclosure can be derived from the exemplary embodiment described below and shown in the drawings, which should in no way be interpreted as limiting the disclosure, and from the dependent claims.

DRAWINGS

The drawings described herein are for illustrative purposes only of selected embodiments and not all possible implementations, and are not intended to limit the scope of the present disclosure.

DETAILED DESCRIPTION

Figure 1:
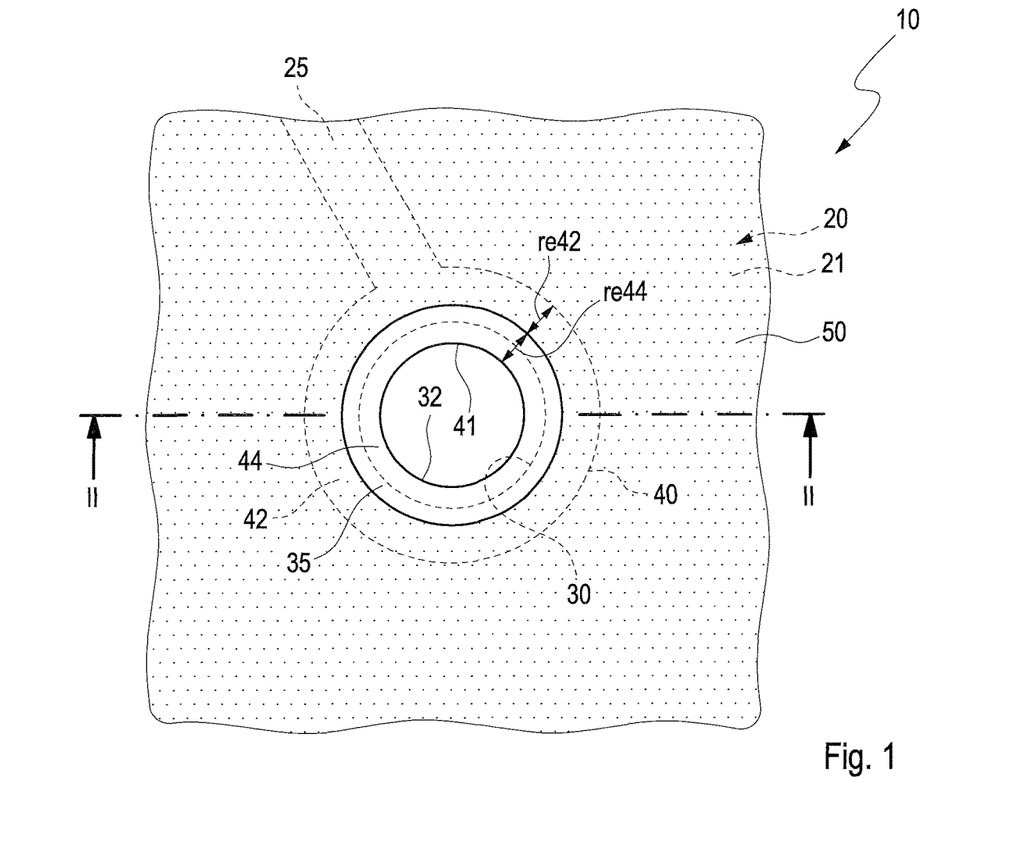
FIG. 1 is a plan view of a portion of a printed circuit board module.
Figure 2:
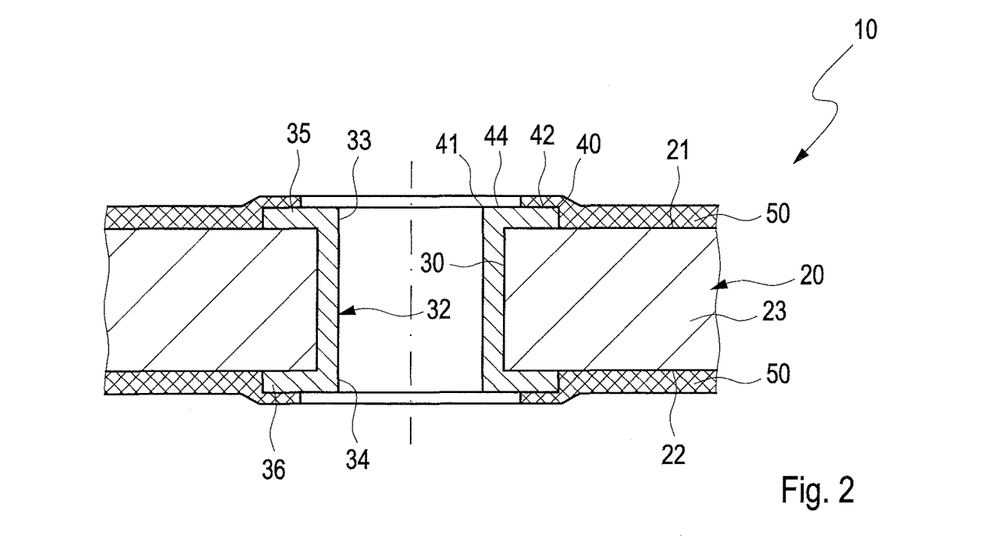
FIG. 2 is a sectional view of the portion of FIG. 1 along the line II-II of FIG. 1.

FIG. 1 is a plan view of a portion of a printed circuit board module 10. FIG. 2 is the portion of the printed circuit board module 10 in a section along the line II-II of FIG. 1.

The printed circuit board module 10 has a printed circuit board 20 with a first side 21 and a second side 22. The printed circuit board 20 has a substrate 23. The substrate 23 is also referred to as a carrier. It is typically made of an electrically insulating material such as epoxy resin, teflon, or particularly fiber reinforced epoxy resin. The printed circuit board 20 has a contact hole 30.

A sleeve-type via 32 is provided in the hole 30. On at least one side 33 or 34, respectively, an annular ring 35 or 36, respectively, is associated with the via 32. Annular rings are also referred to as pads or soldering eyelets. The annular ring 35 is disposed on the first side 21 of the printed circuit board 20. The annular ring 36 is disposed on the second side 22. The annular rings 35, 36 are electrically connected to the via 32. The rings 35, 36 have an annular ring edge 40, at least in sections thereof.

It is also visible in FIG. 1 that a conductive path 25 is connected to the annular ring 35. No annular ring edge 40 is present in the region of the conductive path 25, since the conductive path 25 is directly connected to the annular ring 35.

The sleeve-type via 32 and the annular ring 35 or 36, respectively, are formed of an electrically conductive material (electrical conductor). A metal or metal alloy, for example copper or a copper alloy (e.g. with nickel) can be used as the electrically conductive material for the conductive path 25. The via 32 and the annular rings 35 or 36, respectively; in special cases, it is conceivable to include coatings with gold and silver. It is also possible to use different materials for the via 32 and the annular rings 35 or 36, respectively.

The printed circuit board module 10 has a solder resist layer 50. It can be called a solder mask layer. The mask layer is on the first side 21 and the second side 22. In the exemplary embodiment, the solder resist layer 50 extends from outside the annular ring edge 40 over the annular ring edge 40 to an outer region 42 of the annular ring 35 or 36, respectively. An inner region 44 on the annular ring 35, 36 is not covered by the solder resist layer 50. The solder resist layer is graphically highlighted in FIG. 1. In the case of a transparent solder resist layer 50, all lines except for the section line II-II and the line outlining the position of the contact hole 30 are visible on a printed circuit board according to FIG. 1.

Another option is to apply the solder resist layer 50 in such a manner that it only extends in sections from outside the annular ring edge 40 over the annular ring edge 40 to the outer region 42 of the annular ring 35, 36.

The inner region 44 is ring-shaped in the exemplary embodiment. The inner region 44 has a radial extension re44 of at least 0.05 mm. Preferably, the extension is at least 0.10 mm and particularly preferably at least 0.30 mm, around the contact hole 30, at least in sections. The radial extension re44 is measured radially outward from the inner annular ring edge 41 to the beginning of the solder resist layer 50. In the exemplary embodiment, the inner region 44 of the annular ring 35 has a ring-shaped design of two concentric circles. Thus, the radial extension re44 around the contact hole 30 is the same at each point. In practice, the radial extension re44 will vary somewhat in sections. This is due to a respective specification of the mask for the solder resist layer 50 or inaccurate drilling of the contact hole 30.

The outer region 42 of the annular ring 35 is preferably also formed in a ring shape. The outer region 42 of the annular ring, which ring is coated with the solder resist layer 50, preferably has a radial extension, at least in sections, around the contact hole 30 of at least 0.05 mm. Preferably, the extension is at least 0.10 mm and particularly preferably at least 0.3 mm. In the exemplary embodiment, the outer region 42 around the contact hole is the same at each point. Thus, the same applies to the radial extension re42 of the outer region 42.

The annular ring 35 in the exemplary embodiment is electrically connected to a conductive path 25. The electrical connection is preferably provided in the outer region 42 of the annular ring 35. Likewise, multiple conductive paths 25 may be electrically connected to the annular ring 35.

The inner region 44 of the annular ring 35 is preferably provided to enable an electrical connection with a pin 14. The pin 14 extends, at least in sections, into the contact hole 30.

The solder resist layer 50 protects its region against corrosion and mechanical damage. Also, it prevents the printed circuit board from being wetted with the solder during soldering. It is frequently provided as a green layer. It is applied in such a manner that the pads (annular rings) and component contacts remain free. The resist layer is, for example, applied by screen printing, spraying, or curtain coating. The solder resist layer 50, provided to the outer region 42 of the annular ring 35, protects the annular ring 35, particularly in the region of the annular ring edge 40.

If the printed circuit board module 10 is, for example, exposed to an aggressive medium, such as transmission fluid, the annular ring 35 is at least protected in the outer region 42 by the solder resist layer 50, from the aggressive medium Transmission fluid contains sulfur and thus results in increased corrosion.

The inner region 44, however, is not covered by the solder resist layer 50. Therefore, a solder joint can be made, for example, in the inner region 44.

In the exemplary embodiment, the via 32 is provided with a hole diameter of 1.2 mm. The copper layer of the annular ring 35 or 36, respectively, has a thickness of 35 μm. The diameter of the annular ring 35 is 2.5 mm. Typically, it is 1.8 mm when no outer region 42 is provided. The inner region 44 has a diameter of 1.8 mm. Thus, the inner region 44 of the annular ring 35 matches the typical diameter of 1.8 mm. The radial extension re44 of the inner region 44 thus is (1.8 mm−1.2 mm)/2=0.3 mm. The radial extension re42 of the outer region 42 thus is (2.5 mm−1.8 mm)/2=0.35 mm. These numerical values are advantageous, but other values may be used. The variables also depend on the sizes of the pins 14 and the to be expected current levels.

Figure 3:
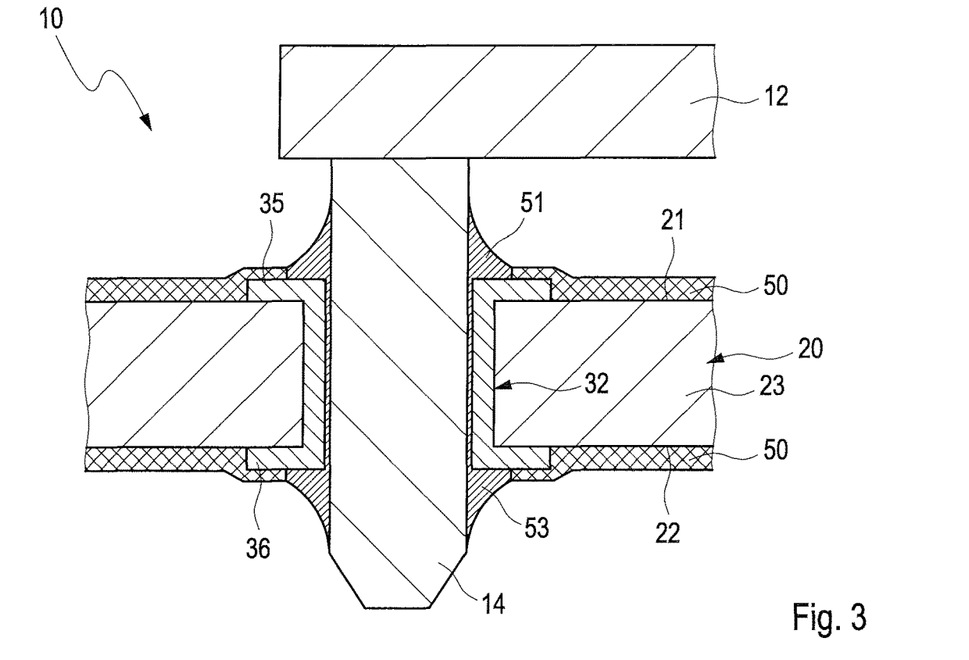
FIG. 3 is a cross-sectional view of the printed circuit board module of FIG. 1 with an electronic component.

FIG. 3 shows the printed circuit board module 10 of FIG. 1 and FIG. 2. An electrical or electronic component 12 with a pin 14 is electrically connected at the via 32 to the annular rings 35, 36. The component 12 can, for example, be a transistor with three pins 14, an IC having six or eight pins 14, or a contact pin having one or two pins 14. Contact pins 14 are, for example, used to electrically connect two printed circuit boards. They have a pin 14 on at least one side.

A solder joint with solder 51 is visible on the first side 21 of the printed circuit board 20. A solder joint with solder 53 is visible on the second side 22 of the printed circuit board 20. The solder joints are in contact with both the pin 14 and with the inner region 44 of the annular ring 35 or 36, respectively. The solder 51, 53, of the solder joints, extends preferably through the contact hole 30 into the region between the pin 14 and the via 32. This ensures a connection between the pin 14 and the via 32 over a large area and a reliable solder joint. In the exemplary embodiment, the solder 51, 53 has a typical shape, also called a soldering meniscus, in the region between the pin 14 and the inner region 44 of the annular ring 35 or 36, respectively. The outer region 42 is used as an additional holding area for the annular ring 35 and reduces the risk of detachment of the annular ring 35.

Figure 4:
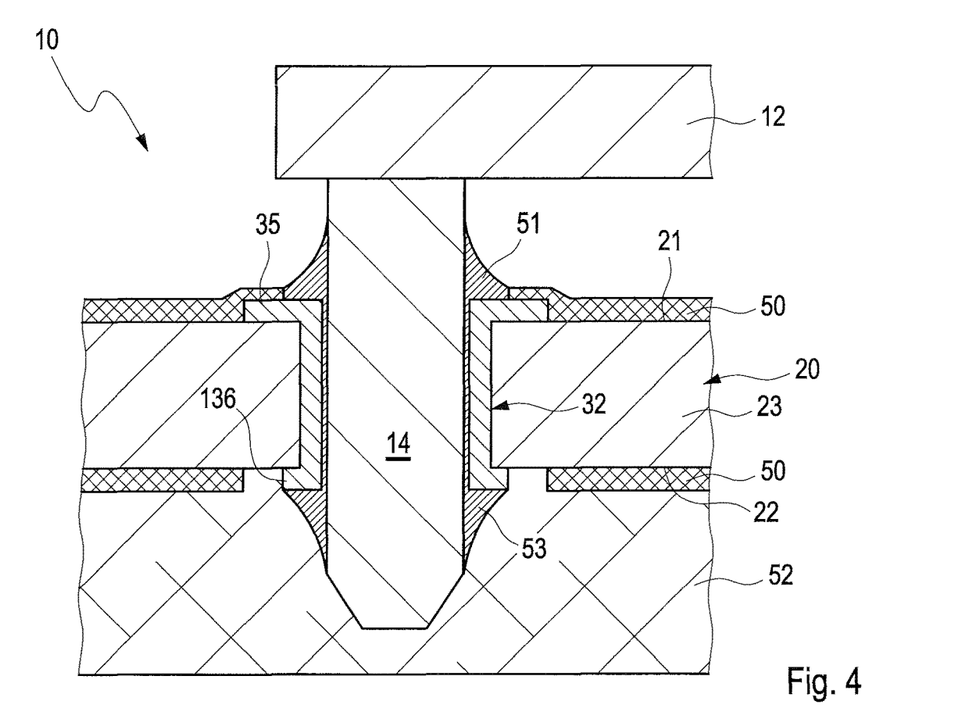
FIG. 4 is a cross-sectional view of another embodiment of a printed circuit board module with a protective layer.

FIG. 4 shows another embodiment where the via 32 includes an annular ring 35 on the first side 21 that is partially covered by a solder resist layer 50. On the second side 22 an annular ring 136 is provided that is spaced apart from an associated solder resist layer 50. An additional protective layer 52 includes a casting resin is provided to protect the second side 22. Casting resins that can be used include, for example, an epoxy resin, a copolymerisate of polyurethane and polyacrylate, or a polyurethane-based casting resin. Casting resins can be poured or dripped onto the printed circuit board and then cure. Some casting resins can be cured by irradiation with UV light. Casting resins are also called dense layer coatings. The protective layer 52 preferably covers the side 22 of the printed circuit board 20 that faces away from the component 22, at least in the region of open electrical contacts, more preferably completely.

Figure 5:
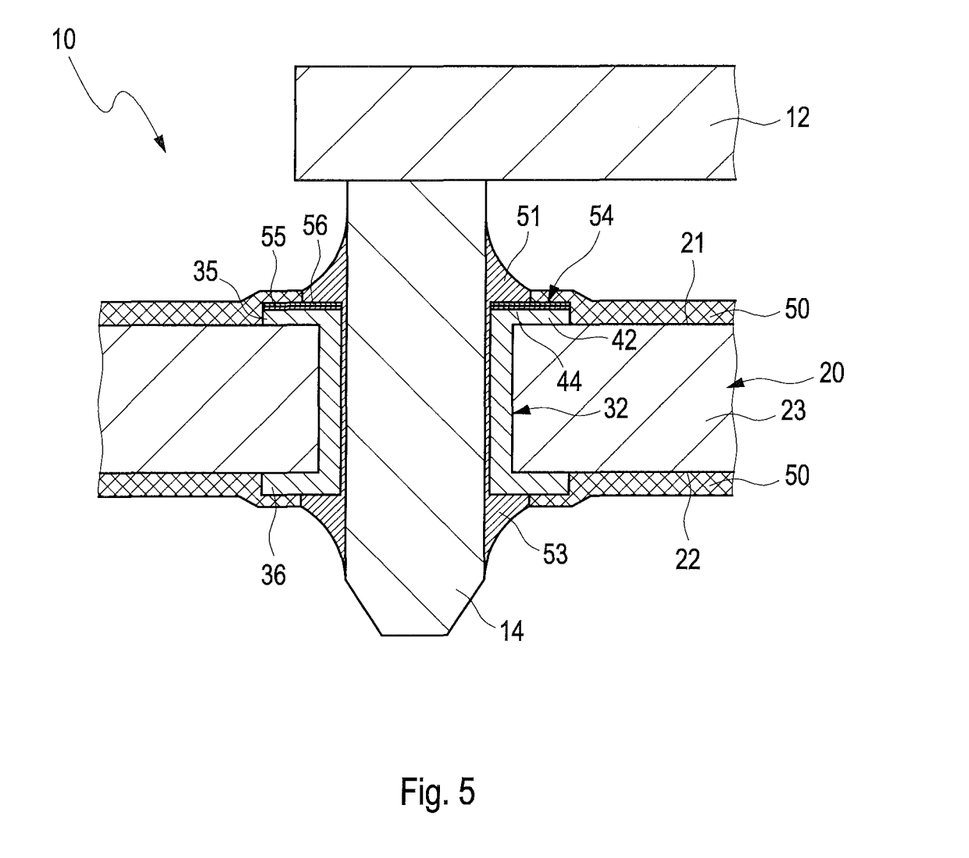
FIG. 5 is a cross-sectional view of another embodiment of a printed circuit board module with an ENIG layer.

FIG. 5 shows another embodiment of the printed circuit board module 10. It is mostly designed like the exemplary embodiment shown in FIG. 3. In addition, however, the annular ring 35 is provided with a metallic coating on the first side 21 of the printed circuit board 20. A so-called ENIG layer 54 is provided on the annular ring 35. The ENIG layer 54 has a nickel-containing layer 55 on the annular ring 35. The nickel-containing layer 55 is again coated with a gold-containing layer 56. The nickel-containing layer 55 typically has a thickness in the range from 3 to 6 μm. It preferably contains nickel with a mass fraction of at least 0.5, more preferably of at least 0.8. The gold-containing layer 56 typically has a thickness in the range from 0.05 to 0.10 μm. It preferably contains gold with a mass fraction of at least 0.5, more preferably of at least 0.8. The ENIG layer 54 allows very planar surfaces. The nickel-containing layer 55 is protected from oxidation and corrosion by the thin gold-containing layer 56. The nickel-containing layer 55 can be coated chemically (electroless). The gold-containing layer 56 then can be applied. The name "ENIG" is an abbreviation of "electroless nickel immersion gold".

A specialty of the shown ENIG layer 54 is that it extends both into the inner region 44 and into the outer region 42 of the annular ring 35. This can be achieved by applying the ENIG coating before applying the solder resist layer 50. The arrangement shown has the advantage that the annular ring 35 is well protected from aggressive media when the solder resist layer 50 is incomplete or has a crack, for example. If the ENIG layer were applied after applying the solder resist layer 50, only the inner region 44 of the annular ring 35 would be protected.

Likewise, the annular ring 36 can be provided with an ENIG layer 54, where required. But if an additional protective layer 52, as shown in FIG. 4 is provided, it is sufficient to provide the ENIG layer on the first side 21 of the printed circuit board 20 only.

The ENIG layer 54 is preferably provided on all conductive elements on the respective side of the printed circuit board 20. This includes any conductive paths 25 (see FIG. 1).

Figure 6:
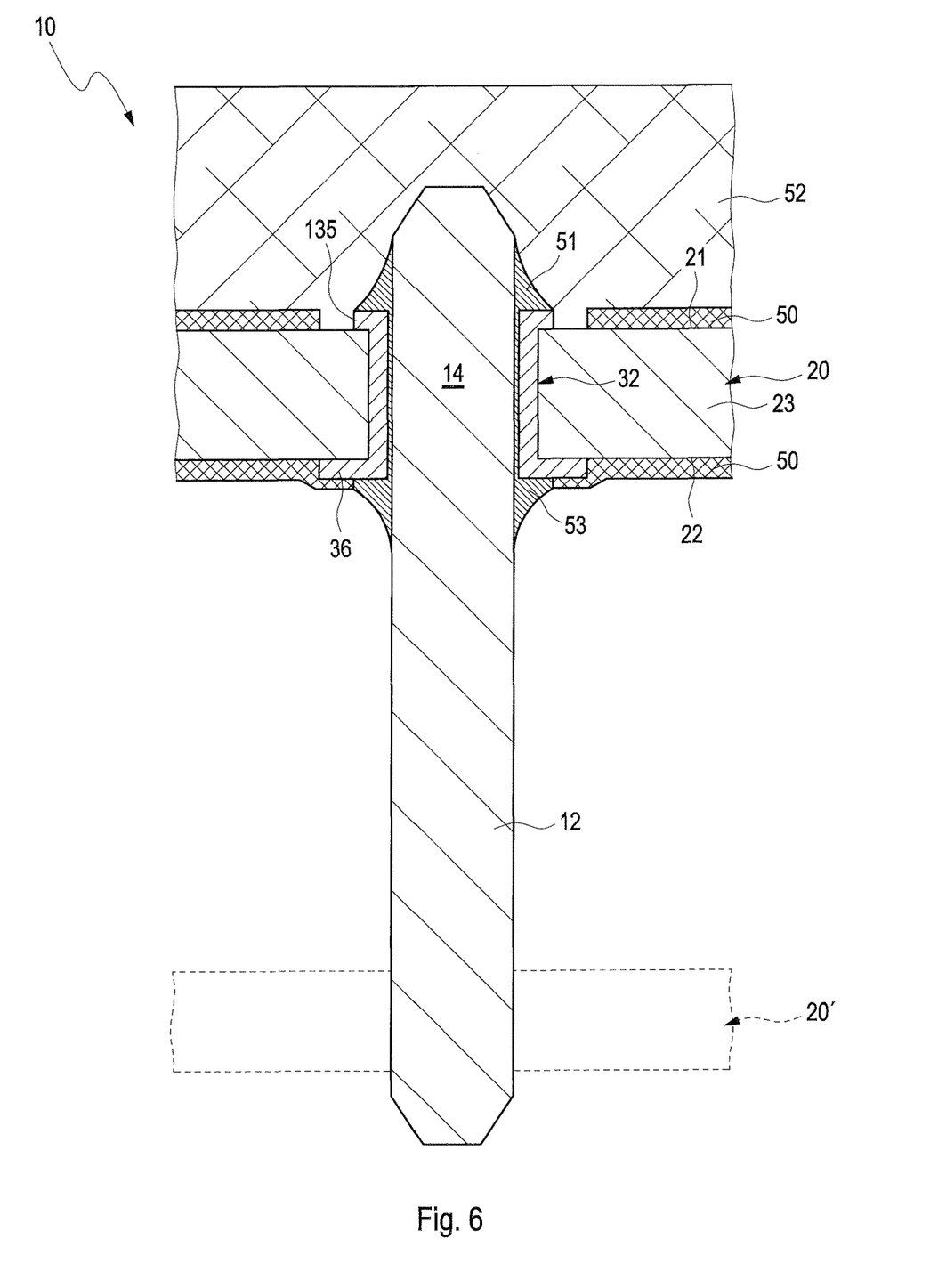
FIG. 6 is a cross-sectional view of another embodiment of a printed circuit board module with a protective layer.

FIG. 6 shows another exemplary embodiment of the printed circuit board module 10. On the first side 21 of the printed circuit board 20, an annular ring 135 is provided that is protected by a solder resist layer 50. An annular ring 36, protected by a solder resist layer 50, is provided on the second side 22 of the printed circuit board 20. A via 32 is provided. In the exemplary embodiment, the component 12 is configured as a contact pin having one pin 14. These contact pins are, for example, used for electrical contacting of two printed circuit boards. The bottom end in FIG. 6 may be connected to a schematically shown second printed circuit board 20'.

For assembly, the printed circuit board 20 can be slid onto the contact pin and then joined by soldering. In some use cases, the region of the second side 22 is no longer well accessible after soldering. For example, when the printed circuit board 20 abuts with a housing part not shown herein. In this case, the second side 22 of the printed circuit board 20 can no longer be sealed after assembly. It is therefore advantageous to provide an annular ring 36 with protection by the solder resist layer 50 on the second side 22 in such cases. If the first side 21 of the printed circuit board 20 is accessible after assembly, a protective layer 52 as described in FIG. 4 can be provided on this side. Since such a protective layer 52 typically provides good corrosion protection, the annular ring 135 on the first side 21 of the printed circuit board 20 can be configured without protection by the solder resist layer 50. For increased reliability, the annular ring on the first side 21 can also be protected by a solder resist layer 50.

Figure 7:
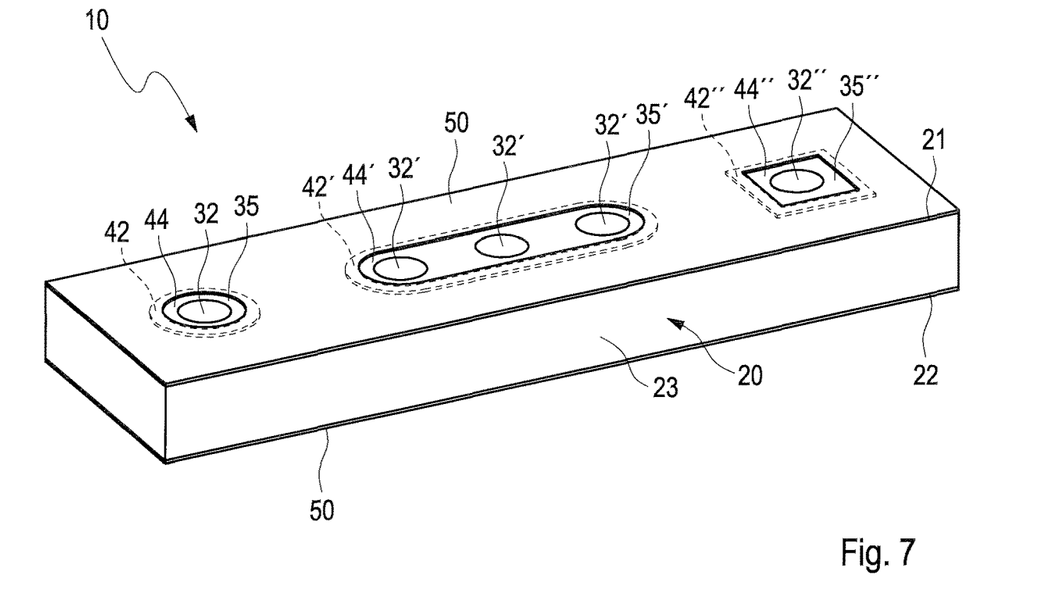
FIG. 7 is a perspective view of another embodiment of a printed circuit board module with different annular ring shapes.

FIG. 7 shows examples of different geometries for the annular rings.

The via 32 has an annular ring 35 with a ring-shaped hollow cylindrical inner region 44 and a ring-shaped hollow cylindrical outer region 42.

The vias 32' have a common annular ring 35' with a rectangular inner region 44' with rounded corners and a ring shaped outer region 42' with a rectangular contour and rounded corners. Such a design allows electrical connections among multiple components or an electrical connection of one component with multiple pins for high current levels.

The via 32" has an annular ring 35" with a ring-shaped inner region 44". It has a ring-shaped contour on the inside and a rectangular contour on the outside. A ring-shaped outer region 42" has a rectangular contour on the inside and on the outside.

The shape of the annular ring 35" can thus be implemented as a rectangle, a polygon, as a union of adjacent vias, or in another form. It is preferred that a solder resist layer 50 is provided in such a manner that the outer contour of the annular ring is coated with the solder resist layer 50. This at least partially covers the annular ring 35.

Figure 8:
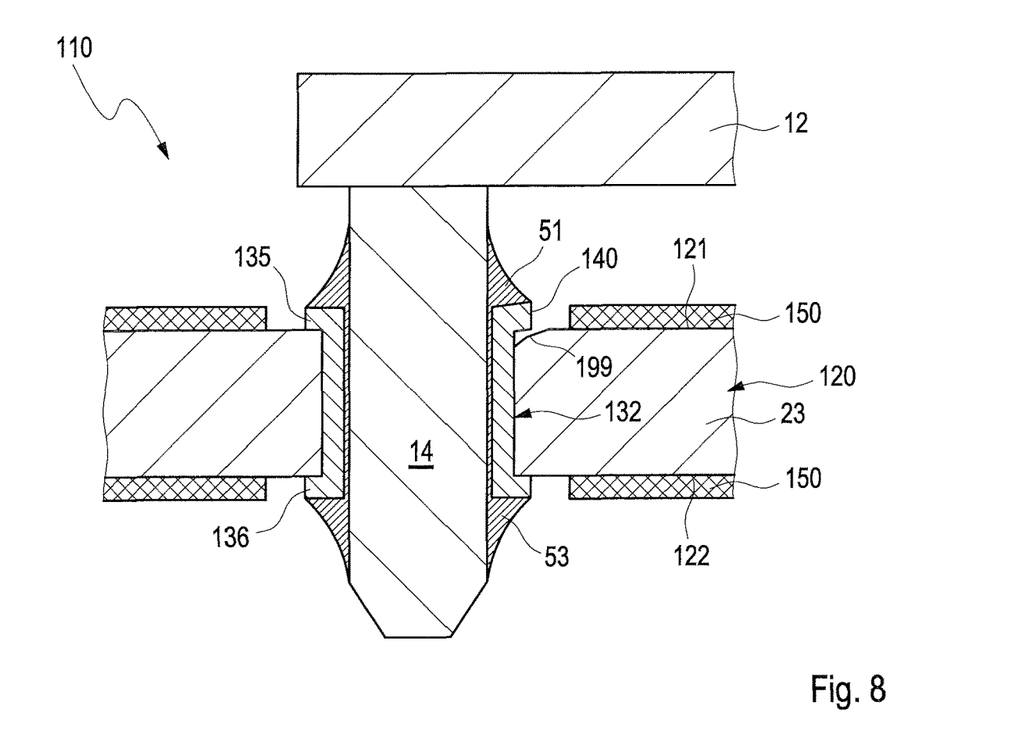
FIG. 8 is a cross-sectional view of a printed circuit board module with corrosion damage.

FIG. 8 shows a printed circuit board assembly 110 having a printed circuit board 120 and a via 132 with a first annular ring 135 and a second annular ring 136. A solder resist layer 150 is provided on both sides 121, 122 of the printed circuit board 120. It has a distance from the annular ring edges 140 of the annular rings 135, 136. Such a distance is typically specified to exclude undesirable coverage of the annular ring 135 due to manufacturing tolerances of the solder resist layer 150. This would prevent a solder joint in the coated region. Damage of the printed circuit board assembly 110 is outlined at a point 199. The annular ring 135 is lifted in the region 199, which is also called "pad lifting". Such lifting can be caused during soldering by the forces generated during cooling or after soldering due to different thermal expansion coefficients of the materials. Furthermore, an aggressive medium can penetrate into the region between the annular ring 135 and the printed circuit board 120. This causes printed circuit board corrosion, particularly copper corrosion, as well as damage to the base material of the printed circuit board.

Particularly, severe effects can be generated if corrosion produces conductive deposits that cause short circuiting between multiple contacts.

In tests, the printed circuit board assemblies 110 are for example exposed to a sulfur-containing transmission fluid at up to 140° C.

Figure 9:
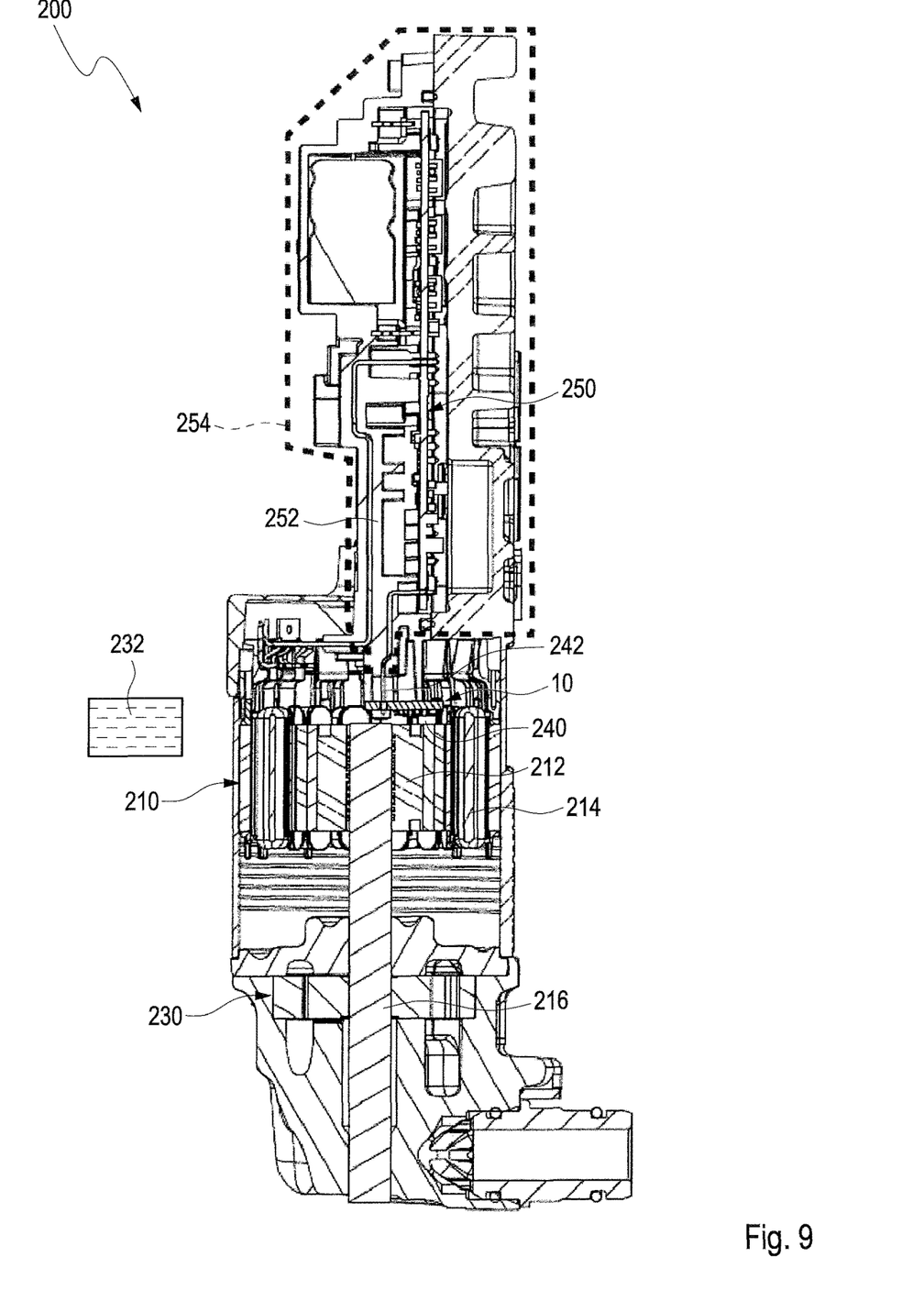
FIG. 9 is a cross-sectional view of a preferred sample application of the printed circuit board module.

FIG. 9 shows a preferred exemplary embodiment of a printed circuit board module 10, as described in the preceding figures. A pump assembly 200 has an electric motor 210 and a pump 230. The electric motor 210 has a rotor 212 and a stator 214. By way of example, the rotor 212 is shown as an internal rotor. The stator 214 is shown as an external stator. The rotor 212 is configured to drive the pump 230. In the exemplary embodiment shown, the rotor 212 is connected to the pump 230, via a shaft 216. The torque may also be transmitted by a gear mechanism. The pump 230 is configured as a gerotor pump in the exemplary embodiment. But another type of pump, e.g. a flow pump, can also be used. The printed circuit board module 10 includes at least one rotor position sensor 240, preferably three rotor position sensors 240. These rotor position sensors 240 determine the rotor position of the rotor 212.

The electronic control system 250 is integrated and disposed in a housing 252 in the exemplary embodiment shown. The sealed region is provided with a schematic frame 254. Contact pins 272 are provided between the electronic control system 250 and the printed circuit board module 10 and connect the same to each other. The contact pins 242 can be injection molded into the housing 252 to prevent the ingression of a medium to be delivered into the housing 252 by this type of sealing. Other sealing options are known, e.g. by means of rubber sealing members.

The rotor 212 and the printed circuit board module 10 are provided for being disposed in the medium 232 to be delivered by the pump 230. The rotor 212 and the printed circuit board module 10 are thus not sealed against the regions where the medium 232 is present. Where a housing is provided around the electric motor 210, it can be configured with holes, or the region through which the shaft extends can be configured with grooves. The holes or grooves allow the medium 232 to be delivered to flow through along the shaft 216. Another option is to largely eliminate the housing around the electric motor 210 and to just provide a mechanical connection between the electric motor 210 and the pump 230, in the form of webs. By taking at least one of these measures, the module can be disposed in the medium.

In tests of the present pump assembly 200, providing a printed circuit board module 10 has proved very advantageous. The side of the printed circuit board module 10 with the rotor position sensors 240, i.e. the side facing the rotor 212, can be protected with a casting resin after the printed circuit board module 10 and the contact pins 242 are soldered together. The side facing away from the rotor 212, however, can no longer be protected by casting resin after soldering the printed circuit board module 10. This is because sections of the side facing away are covered by the housing 252. It is therefore advantageous to provide annular rings protected by the solder resist layer on the side facing away, which results in a corrosion resistant assembly. This assembly can also be used for delivering oils, particularly mineral oils. In practice, transmission fluid has proved particularly corrosive due to the sulfur it contains.

The embodiment of the printed circuit board module 10 shown and described in FIG. 6 and its optional variations are preferred for use.

Naturally, manifold modifications and variations are conceivable within the scope of the disclosure.

The printed circuit boards 20 in the exemplary embodiments can be configured in one or two layers, respectively. The disclosure can also be used for multi-layer printed circuit boards with conductive paths in the substrate 23. The vias 32 may electrically connect two adjacent or non-adjacent layers of conductive paths, or three or more layers of conductive paths.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A printed circuit board module comprising:
a printed circuit board including a first side, a second side and a contact hole;
a sleeve-type via is provided in the contact hole, an annular ring is associated with the via on at least one side, the annular ring is disposed on the first side or on the second side of the printed circuit board and electrically connected to the via, the annular ring, at least in sections, includes an annular ring edge;
the printed circuit board module includes a solder resist layer, the solder resist layer extends, at least in sections, from outside the annular ring edge over the annular ring edge to an outer region of the annular ring;
an inner region, not covered by the solder resist layer, remains on the annular ring;
a nickel-containing layer is applied to at least one annular ring; and a gold-containing layer is applied to the nickel-containing layer;
wherein the nickel-containing layer and the gold-containing layer extend, at least in sections, into the inner region and into the outer region.

2. The printed circuit board module according to claim 1, wherein the inner region is ring-shaped.

3. The printed circuit board module according to claim 1, wherein the inner region around the contact hole, at least in sections, has a radial extension of at least 0.05 mm, preferably of at least 0.10 mm, particularly preferably of at least 0.30 mm.

4. The printed circuit board module according to claim 1, wherein the inner region around the contact hole, at each point, has a radial extension of at least 0.05 mm, preferably of at least 0.10 mm, particularly preferably of at least 0.30 mm.

5. The printed circuit board module according to claim 1, wherein the outer region is ring-shaped.

6. The printed circuit board module according to claim 1, wherein the outer region around the contact hole, at least in sections, has a radial extension of at least 0.05 mm, preferably of at least 0.10 mm, particularly preferably of at least 0.30 mm.

7. The printed circuit board module according to claim 1, wherein the outer region around the contact hole, at each point, has a radial extension of at least 0.05 mm, preferably of at least 0.10 mm, particularly preferably of at least 0.30 mm.

8. The printed circuit board module according to claim 1, wherein the printed circuit board comprises a conductive path that is electrically connected to the outer region of the annular ring.

9. The printed circuit board module according to claim 1, comprising a component including a contact pin, the contact pin being at least partially disposed in the via, and the printed circuit board module further comprising solder, the solder being mechanically and electrically connected to the contact pin and to the inner region of the annular ring.

10. The printed circuit board module according to claim 9, wherein the solder is only mechanically connected to the inner region of the annular ring.

11. The printed circuit board module according to claim 9, wherein a protective layer made of casting resin is provided on at least one side of the printed circuit board to ensure protection of the printed circuit board.

12. A pump assembly having an electric motor and a pump, the electric motor including a rotor and a stator, the rotor configured to drive the pump, the pump assembly comprising:
a printed circuit board module according to claim 1;
the printed circuit board module comprising at least one rotor position sensor;
the at least one rotor position sensor determining the rotor position of the rotor;
wherein the rotor and the printed circuit board module enable arrangement in medium to be delivered by the pump.

13. The pump arrangement according to claim 12, wherein the medium to be delivered by the pump is an oil, particularly a mineral oil.

* * * * *